(12) United States Patent
Hayashida

(10) Patent No.: US 6,753,240 B2
(45) Date of Patent: Jun. 22, 2004

(54) SEMICONDUCTOR DEVICE PRODUCTION METHOD

(75) Inventor: Yukinobu Hayashida, Tateyama (JP)

(73) Assignee: UMC Japan, Chiba-ken (JP)

( * ) Notice: Subject to any disclaimer, the term of this patent is extended or adjusted under 35 U.S.C. 154(b) by 0 days.

(21) Appl. No.: 10/152,102

(22) Filed: May 21, 2002

(65) Prior Publication Data

US 2003/0045076 A1 Mar. 6, 2003

(30) Foreign Application Priority Data

Aug. 29, 2001 (JP) .................................... P2001-260341

(51) Int. Cl.⁷ ............................................. H01L 21/425
(52) U.S. Cl. ........................................ 438/515; 438/551
(58) Field of Search .................................. 438/515, 551

(56) References Cited

U.S. PATENT DOCUMENTS 6,437,404 B1 * 8/2002 Xiang et al. ................ 257/347

\* cited by examiner

*Primary Examiner*—John F. Niebling
*Assistant Examiner*—Christopher Lattin
(74) *Attorney, Agent, or Firm*—Scully, Scott, Murphy & Presser

(57) ABSTRACT

The present invention provides a semiconductor device production method that eliminates the risk of the occurrence of residual resist in the production process, and as a result, allows the electrical characteristics and reliability of the device to be improved. In this semiconductor device production method comprising steps of: subsequently laminating a first resist layer and a second resist layer having desired patterns on a semiconductor substrate, forming a first conductive region on the semiconductor substrate by injecting a first ion into the semiconductor substrate using the first and second resist layers as masks, removing the second resist layer, forming a second conductive region on the semiconductor substrate by injecting a second ion into the semiconductor substrate using the remaining first resist layer as a mask, and removing the first resist layer.

16 Claims, 5 Drawing Sheets

SEMICONDUCTOR DEVICE PRODUCTION METHOD

BACKGROUND OF THE INVENTION

1. Field of the Invention

The present invention relates to a semiconductor device production method, and more particularly, to a semiconductor device production method that eliminates the risk of resist remaining on the semiconductor substrate and therefore prevents problems such as shorting defects caused by residual resist during formation of a P region and an N region at locations where the source and drain of a semiconductor device are to be formed by ion injection using a resist layer as a mask.

2. Description of the Related Art

The most frequently used type of semiconductor device in the prior art are ICs employing a CMOS structure (CMOSIC) in which a P MOS transistor and N MOS transistor are connected in series.

FIGS. 3A through 3D are process drawings showing an example of a semiconductor device production method of the prior art. This example shows the case of a CMOSIC in which a P region (first conductive region) and an N region (second conductive region) are formed on an N silicon substrate (semiconductor substrate).

At first, as shown in FIG. 3A, a positive photoresist is coated onto the N silicon substrate 1 on which a gate (G) has already been formed to form a resist layer 2, a photomask 3 having a prescribed mask pattern is placed on top of this, and the mask pattern of the photomask 3 is burned onto the resist layer 2 by irradiating with ultraviolet rays 4. In this photomask 3, the portion corresponding to a P transistor (Tr) region 5 of the N silicon substrate 1 is not open, but rather since only the portion corresponding to an N transistor (Tr) region 6 is open, only a portion 7 corresponding to the N-Tr region 6 of the N silicon substrate 1 in the resist layer 2 is irradiated with ultraviolet rays and is soluble in developing solution. Furthermore, in the drawing, P-Tr indicates the P Tr region 5, while N-Tr indicates the N Tr region 6.

Next, as shown in FIG. 3B, the photosensitive portion 7 is dissolved in developing solution by developing this resist layer 2, an opening 8 is formed in the resist layer 2, and $As^+$ ions (N+) 11 are injected using this resist layer 2 as a mask. As a result, an N region 12 is formed on the N silicon substrate 1.

Next, this resist layer 2 is removed, and as shown in FIG. 3C, a positive photoresist is again coated onto the N silicon substrate 1 to form a resist layer 13, a photomask 14 having a prescribed mask pattern is placed on top of it, and the mask pattern of the photomask 14 is burned onto the resist layer 13 by irradiating with ultraviolet rays 4.

Since only the portion of this photomask 14 corresponding to the P Tr region 5 is open, in the resist layer 13, only a portion 15 corresponding to this P Tr region 5 is exposed to ultraviolet rays and soluble in the developing solution.

Next, as shown in FIG. 3D, the portion 15 corresponding to the P Tr region 5 is dissolved in the developing solution by developing this resist layer 13, an opening 16 is formed in resist layer 13, and $BF_2^+$ ions (P−) 17 are injected using this resist layer 13 as a mask. As a result, a P region 18 is formed in the N silicon substrate 1.

Subsequently, the resist layer 13 is removed. In this manner, the P region 18 and the N region 12 are formed in the N silicon substrate 1, and a CMOSIC is fabricated by using this N silicon substrate 1.

However, in the production method of the prior art described above, since the resist layer 2 is removed after having formed the N region 12 and the resist layer 13 is removed after having formed the P region 18, since the step of removing the resist layers 2 and 13 on the substrate 1 must be carried out twice, there is the risk of so-called residual resist in which a portion of the resist layers 2 and 13 end Up remaining without being removed during the course of these steps.

For example, although a gate and metal contact are mutually insulated by an insulating film, if the resist remains during etching of the gate film, since this resist forms an electrical connection between the gate and metal contact, there is continuity between the gate and metal contact resulting in the risk of the occurrence of a shorting defect. In addition, in the case the residual resist is extremely thin, there is the risk of a marginal defect.

In this manner, when the resist remains, this residual resist can cause a shorting defect, thereby resulting in the risk of the electrical characteristics of the resulting device being different from the expected characteristics.

This problem has a similar risk of occurring in negative resists as well.

SUMMARY OF THE INVENTION

In consideration of the above circumstances, the object of the present invention is to provide a semiconductor device production method that eliminates the risk of the occurrence of residual resist that has been a problem in production processes of the prior art, and as a result, makes it possible to improve the electrical characteristics and reliability of the device.

In order to solve the above problems, the present invention provides a semiconductor device production method as described below.

Namely, the semiconductor device production method according to a first aspect of the present invention is characterized as being a semiconductor device production method for forming a first conductive region and a second conductive region on a semiconductor substrate comprising steps of: subsequently laminating a first resist layer and a second resist layer having desired patterns on the semiconductor substrate, forming a first conductive region on the semiconductor substrate by injecting a first ion into the semiconductor substrate using the first and second resist layers as masks, removing the second resist layer, forming a second conductive region on the semiconductor substrate by injecting a second ion into the semiconductor substrate using the remaining first resist layer as a mask, and removing the first resist layer.

In this semiconductor device production method, it is preferable that the second resist layer and surface portion of the first resist layer are removed using an etching material having a lower etching rate than the etching material that removes the first resist layer during removal of the second resist layer.

The semiconductor device production method according to a second aspect of the present invention is a semiconductor device production method characterized as being a semiconductor device production method for forming a first conductive region and a second conductive region on a semiconductor substrate comprising steps of: subsequently laminating a first resist layer having a desired pattern, an etching stopper layer, and a second resist layer having a desired pattern on the semiconductor substrate; forming a first conductive region on the semiconductor substrate by injecting a first ion into the semiconductor substrate using the first resist layer, etching stopper layer, and second resist layer as masks; removing the second resist layer and the etching stopper layer; forming a second conductive region on the semiconductor substrate by injecting a second ion into the semiconductor substrate using the remaining first resist layer as a mask; and removing the first resist layer.

In this semiconductor device production method, it is preferable that the etching stopper layer has resistance to the etching material that removes the second resist layer.

Furthermore, in the above described semiconductor device production methods, it is preferable that the first resist layer has lower exposure sensitivity than the second resist layer.

Furthermore, in the above described semiconductor device production methods, it is preferable that the injected amount of the first ion is greater than the injected amount of the second ion.

DETAILED DESCRIPTION OF THE PREFERRED EMBODIMENT

The following provides an explanation of each embodiment of the semiconductor device production method of the present invention based on the drawings.

First Embodiment

An explanation of the semiconductor device production method of a first embodiment of the present invention is provided based on FIGS 1A through 1G. Here, a CMOSIC is used as the example of a semiconductor device, and an explanation is provided for the case of forming a P region (first conductive region) and an N region (second conductive region) on an N silicon substrate (semiconductor substrate). Furthermore, those constituent features that are the same as FIGS. 4A through 4D are indicated with the same reference symbols in FIGS. 1A through 1G.

Figure 1A:
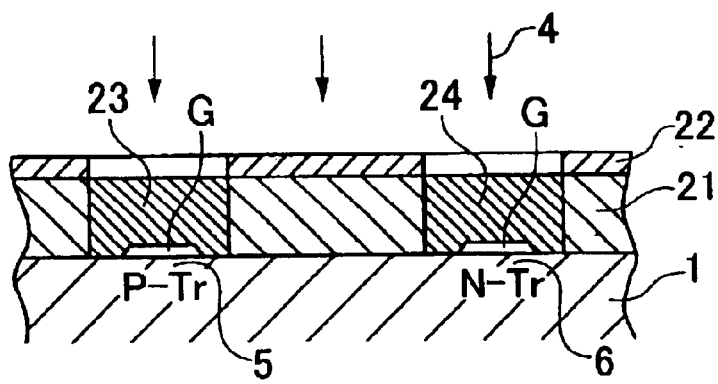
FIG. 1A is a drawing showing the process of semiconductor device production method of a first embodiment of the present invention.

At first, as shown in FIG. 1A, a positive first photoresist is coated onto an N silicon substrate 1 on which a gate (G) has already been formed in a transistor forming region thereof by spin coating, spray coating or dip coating and so forth. Subsequently, this photoresist is heated at, for example, 120° C. by infrared heating and so forth, which together with evaporating organic solvent and other volatile components contained therein, accelerates the chemical reaction to form a first resist layer 21, in which the film is harder than a second resist layer 25 to be described later.

Examples of the photoresist that is preferably used here include quinone diazide-based photoresist or other commercially available positive photoresists. In this first resist layer 21, a method may be employed for improving transfer in which the resist layer is heated at, for example, 130–150° C. by infrared heating to eliminate roughness on the resist surface. According to this method, dimensional changes in the first resist layer 21 following irradiation with ultraviolet rays 4 are small and changes in pattern shape are also small.

Next, a photomask 22 having a prescribed mask pattern is placed on this first resist layer 21, and the mask pattern of the photomask 22 is burned onto the first resist layer 21 by irradiating with the ultraviolet rays 4. Since openings are formed in this photomask 22 at those portions corresponding to a P Tr region 5 and an N Tr region 6, respectively, of the N silicon substrate 1, by using this photomask 22, portions 23 and 24 of the first resist layer 21 respectively corresponding to the P Tr region 5 and the N Tr region 6 of the N silicon substrate 1 are irradiated with the ultraviolet rays 4. These portions 23 and 24 are photosensitized by irradiation with the ultraviolet rays 4, resulting in the formation of a latent image that is soluble in developing solution.

Figure 1B:
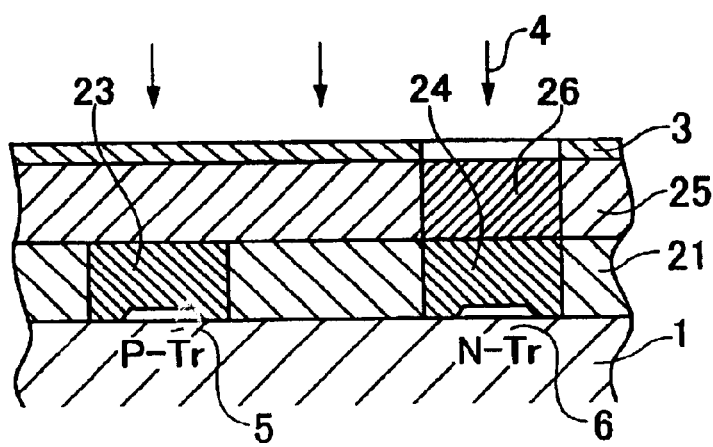
FIG. 1B is a drawing showing the process of semiconductor device production method of a first embodiment of the present invention.

Next, as shown in FIG. 1B, similar to the first photoresist described above, a positive second photoresist is coated on this first resist layer 21 followed by heating this photoresist at a comparatively low temperature of, for example, 90° C. or lower to evaporate organic solvent and other volatile components and accelerate the chemical reaction to form the second resist layer 25 in which the film is softer than the first resist layer 21. Although there are no particular restrictions on the respective exposure sensitivity of this second resist layer 25 and the first resist layer 21, in order to prevent the first resist layer 21 from being exposed during exposure of the second resist layer 25, the exposure sensitivity of this second resist layer 25 is preferably higher than that of the first resist layer 21.

Next, a photomask 3 is placed on this second resist layer 25 in which an opening is formed only for the portion corresponding to the N Tr region 6, and the mask pattern of the photomask 3 is burned onto the second resist layer 25 by irradiating with the ultraviolet rays 4. As a result, only a portion 26 corresponding to the N Tr region 6 of the second resist layer 25 is irradiated with ultraviolet rays, resulting in the formation of a latent image that is soluble in developing solution.

Figure 1C:
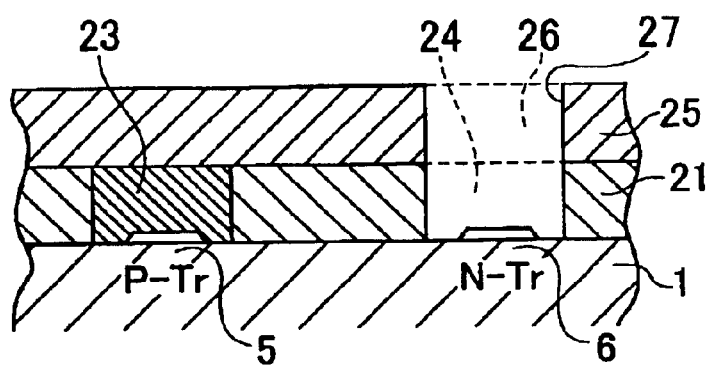
FIG. 1C is a drawing showing the process of semiconductor device production method of a first embodiment of the present invention.

Next, as shown in FIG. 1C, this first resist layer 21 and the second resist layer 25 are developed simultaneously. Here, since the second resist layer 25 fulfills the role of a mask, only portions 24 and 26 of the N silicon substrate 1 corresponding to the N Tr region 6 are eliminated by dissolving in developing solution, and an opening 27 is formed in the first resist layer 21 and the second resist layer 25. As a result, only the N Tr region 6 is exposed to the outside.

Figure 1D:
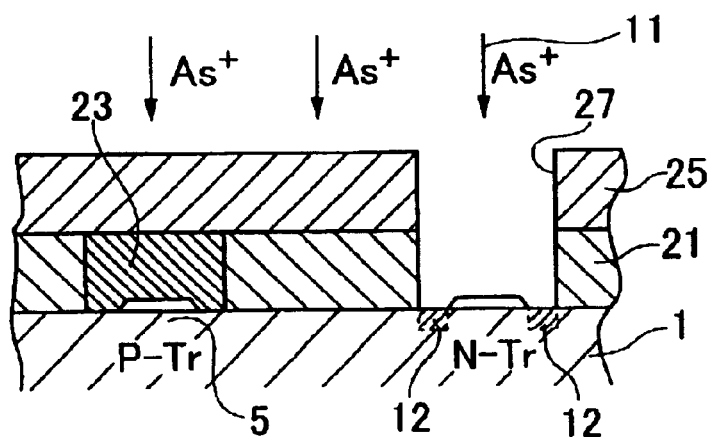
FIG. 1D is a drawing showing the process of semiconductor device production method of a first embodiment of the present invention.

Next, as shown in FIG. 1D, $As^+$ ions (N+) 11 are injected using the first resist layer 21 and the second resist layer 25 as masks. Since $As^+$ ions (N+) are only injected into the N Tr region 6, this N Tr region 6 becomes the N region due to injection of $As^+$ ions.

Next, only the second resist layer 25 is removed by wet etching. Here, examples of etching solutions include etching solutions containing respective prescribed amounts of sulfuric acid ($H_2SO_4$), aqueous ammonia ($NH_4OH$), hydrogen peroxide ($H_2O_2$) and so forth, and as a result of removing by including the portion in close proximity to the surface of the first resist layer 21, the second resist layer 25 can be completely removed.

Furthermore, the etching solution (etching material) used during removal of the second resist layer 25 preferably is an etching solution that has a lower etching rate than the etching solution used during removal of the first resist layer 21. The use of an etching solution having a low etching rate makes it easier to control the etched amount of the second resist layer 25. In addition, although the surface portion of the first resist layer 21 is etched, there is no risk of etching continuing to the inside of that layer.

Figure 1E:
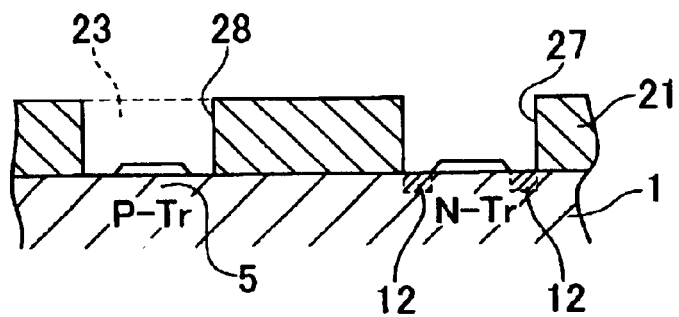
FIG. 1E is a drawing showing the process of semiconductor device production method of a first embodiment of the present invention.

Next, as shown in FIG. 1E, the first resist layer 21 is developed. In this first resist layer 21, since the portion 23 corresponding to the P Tr region 5 of the N silicon substrate 1 is removed as a result of being dissolved by developing solution, an opening 28 is additionally formed in this first resist layer 21. Consequently, the P Tr region 5 and the N region 12 are both exposed to the outside.

Figure 1F:
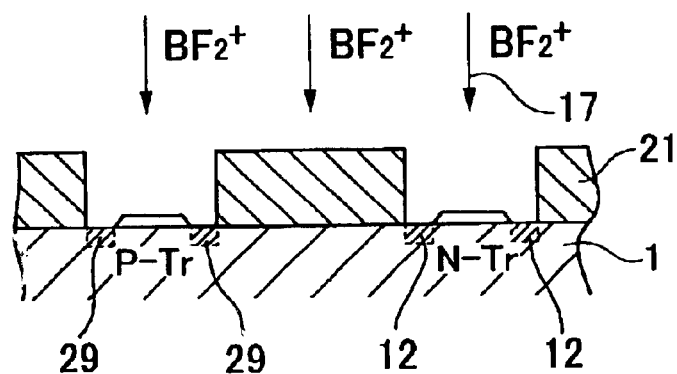
FIG. 1F is a drawing showing the process of semiconductor device production method of a first embodiment of the present invention.

Next, as shown in FIG. 1F, $BF_2^+$ ions (P–) 17 are injected using this first resist layer 21 as a mask. Although $BF_2^+$ ions (P–) are injected into the P Tr region 5 and the N region 12, since the amount of $BF_2^+$ ions (P–) injected is lower than the injected amount of $As^+$ ions (N+), the N state is satisfactorily maintained and does not change to the P state even though $BF_2^+$ ions (P–) are injected into the N region 12. On the other hand, since $As^+$ ions are not injected into the P Tr region 5, this P Tr region 5 becomes a P region 29 due to injection of $BF_2^+$ ions.

Next, the first resist layer 21 is removed by wet etching. Ordinary wet etching is preferably used for this wet etching. For example, after exposing for 30 minutes in oxygen ($O_2$) gas, the first resist layer 21 is immersed for 20 minutes in a mixed solution of sulfuric acid ($H_2SO_4$) and hydrogen peroxide ($H_2O_2$).

Figure 1G:
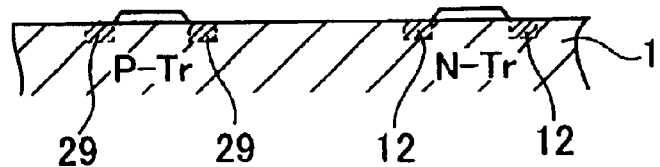
FIG. 1G is a drawing showing the process of semiconductor device production method of a first embodiment of the present invention.

In this manner, as shown in FIG. 1G, the P region 29 and the N region 12 can be formed on the N silicon substrate 1, and there is no risk of resist remaining as in the prior art. A CMOSIC can then be fabricated using the N silicon substrate 1 obtained in this manner.

As has been explained in detail above, according to the semiconductor device production method of the present embodiment, since the first resist layer 21 and the second resist layer 25 are sequentially laminated on the N silicon substrate 1, $As^+$ ions (N+) 11 are injected using these as masks to form the N region 12, only the second resist layer 25 is removed and $BF_2^+$ ions (P–) 17 are injected using the remaining first resist layer 21 as a mask to form the P region 29 followed by removal of the first resist layer 21, the step for removing the photoresist in direct contact with the N silicon substrate 1 consists only of the step of removing the first resist layer 21, thereby making it possible to reduce the step of removing resist layers in contact with the semiconductor substrate. Thus, there is no risk of the occurrence of the problem of the prior art of residual resist, and problems such as shorting defects caused by this residual resist can be solved. As a result, the electrical characteristics and reliability of the resulting device can be improved.

Second Embodiment

The following provides an explanation of a semiconductor device production method of a second embodiment of the present invention based on FIGS. 2A through 2G. Here, similar to the above-mentioned first embodiment, a CMOSIC is used for the example of a semiconductor device, and an explanation is provided for the case of forming a P region and an N region on an N silicon substrate. Furthermore, those constituent features that are the same as in FIGS. 1A through 1G are indicated with the same reference symbols in FIGS. 2A through 2G.

Figure 2A:
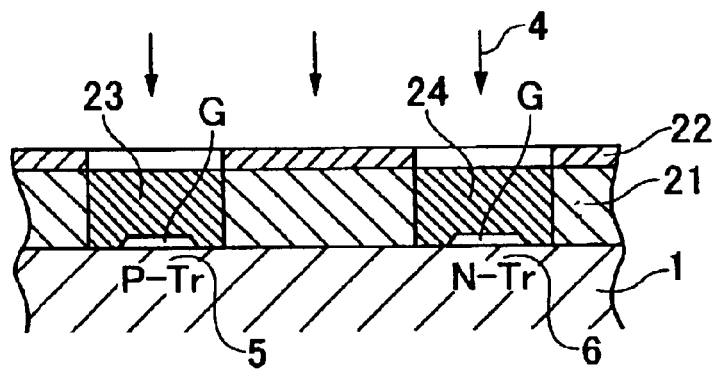
FIG. 2A is a drawing showing the process of semiconductor device production method of a second embodiment of the present invention.

At first, as shown in FIG. 2A, a positive first photoresist is coated onto the N silicon substrate 1 on which a gate (G) has already been formed in the transistor forming region, followed by heating this photoresist at, for example, 120° C. by infrared heating and so forth to form a first resist layer 21.

A method for eliminating roughness of the resist surface may also be employed for this first resist layer 21 by heating at, for example, 130–150° C. to improve transfer.

Next, a photomask 22 having a prescribed mask pattern is placed on this first resist layer 21, and the mask pattern of the photomask 22 is burned onto the first resist layer 21 by irradiating with ultraviolet rays 4. Here, since portions 23 and 24 of the first resist layer 21 respectively corresponding to a P Tr region 5 and an N Tr region 6 of the N silicon substrate 1 are irradiated with ultraviolet rays 4, these portions 23 and 24 are photosensitized by irradiation with ultraviolet rays, resulting in the formation of a latent image that is soluble in developing solution.

Figure 2B:
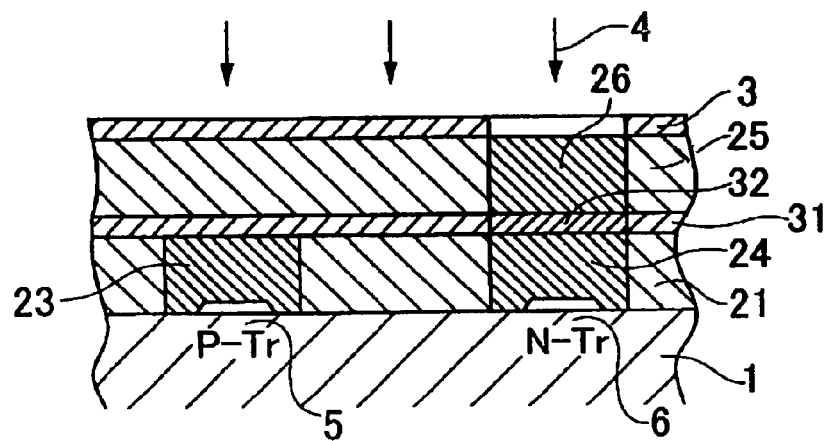
FIG. 2B is a drawing showing the process of semiconductor device production method of a second embodiment of the present invention.

Next, as shown in FIG. 2B, a silicon oxide film 31 that serves as an etching stopper layer is deposited on the first resist layer 21 by, for example, low-temperature chemical vapor deposition (CVD).

This etching stopper layer is resistant to etching solution that removes a second resist layer 25 to be described later.

When depositing this etching stopper layer, deposition by low-temperature CVD is most effect in minimizing the damage to the first resist layer 21. Here, although a portion 32 of the silicon oxide film 31 corresponding to the N Tr region 6 remains, it may also be removed by etching.

Next, a positive second photoresist is coated onto this silicon oxide film 31 followed by heating this photoresist at a comparatively low temperature of, for example, 90° C. or lower to form the second resist layer 25. The exposure sensitivity of this second resist layer 25 is preferably greater than that of the first resist layer 21.

Next, a photomask 3, in which only the portion corresponding to the N Tr region 6 is open, is placed on this second resist layer 25, and the mask pattern of the photomask 3 is burned onto the second resist layer 25 by irradiating with ultraviolet rays 4. In this second resist layer 25, since only a portion 26 corresponding to the N Tr region 6 is irradiated with ultraviolet rays, a latent image is formed that is soluble in developing solution.

Figure 2C:
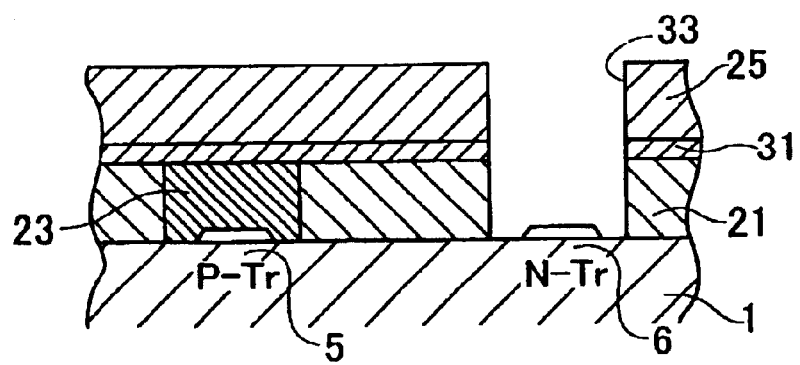
FIG. 2C is a drawing showing the process of semiconductor device production method of a second embodiment of the present invention.

Next, as shown in FIG. 2C, the second resist layer 25 is developed, and a portion 32 of the silicon oxide film 31 corresponding to the N Tr region 6 is removed by etching followed by development of the first resist layer 21. As a result, an opening 33 is formed in the first resist layer 21, the silicon oxide film 31 and the second resist layer 25, and only the N Tr region 6 is exposed to the outside.

Furthermore, etching is not necessary if the portion 32 of the silicon oxide film 31 corresponding to the N Tr region 6 has already been removed.

Figure 2D:
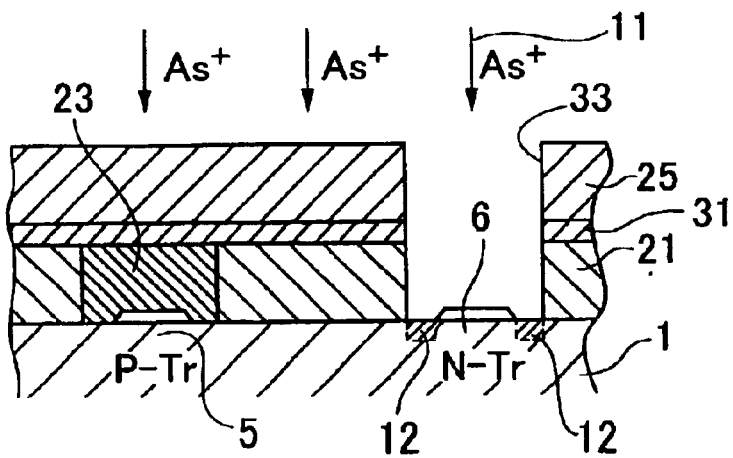
FIG. 2D is a drawing showing the process of semiconductor device production method of a second embodiment of the present invention.

Next, as shown in FIG. 2D, As+ ions (N+) 11 are injected into the N Tr region 6 using the first resist layer 21, the silicon oxide film 31 and the second resist layer 25 as masks. As a result, the N region 12 is formed in the N silicon substrate 1.

Next, only the second resist layer 25 is removed by wet etching. Here, examples of etching solutions preferably include etching solutions containing respective prescribed amounts of sulfuric acid ($H_2SO_4$), aqueous ammonia ($NH_4OH$), hydrogen peroxide ($H_2O_2$) and so forth.

Since the silicon oxide film 31 serving as an etching stopper layer is deposited beneath this second resist layer 25, wet etching stops at the silicon oxide film 31 and does not proceed any farther.

Figure 2E:
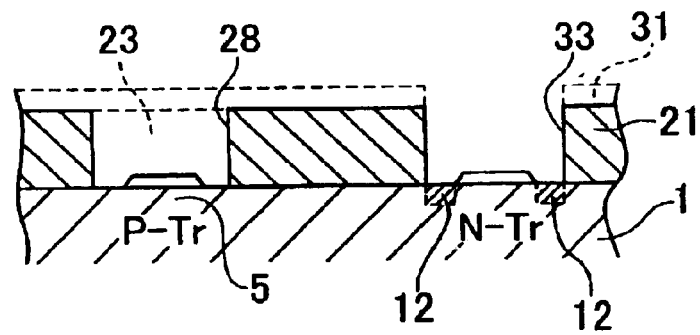
FIG. 2E is a drawing showing the process of semiconductor device production method of a second embodiment of the present invention.

Next, as shown in FIG. 2E, the silicon oxide film 31 is removed by etching followed by development of the exposed first resist layer 21. In this first resist layer 21, since the portion 23 corresponding to the P Tr region 5 of the N silicon substrate 1 is removed as a result of being dissolved by developing solution, an opening 28 is formed. Thus, both the P Tr region 5 and the N region 12 are exposed to the outside.

Figure 2F:
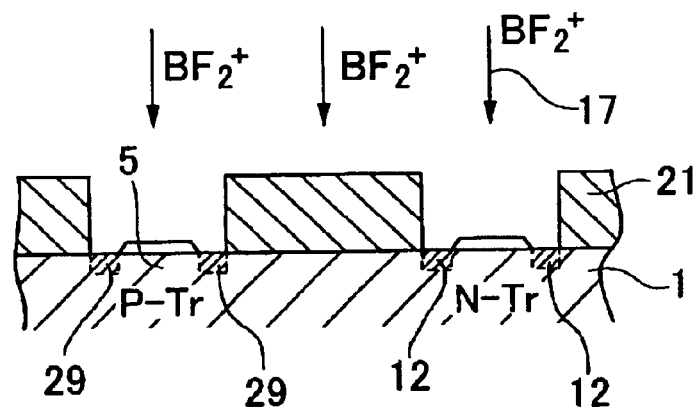
FIG. 2F is a drawing showing the process of semiconductor device production method of a second embodiment of the present invention.

Next, as shown in FIG. 2F, $BF_2^+$ ions (P−) 17 are injected using this first resist layer 21 as a mask. Here, since the amount of $BF_2^+$ ions (P−) injected is lower than the injected amount of $As^+$ ions (N+), the N region 12 is satisfactorily maintained in the N state, while the P Tr region 5 becomes a P region 29 due to injection of $BF_2^+$ ions (P−).

Next, the first resist layer 21 is removed by wet etching. Wet etching is carried out in exactly the same manner as in the above-mentioned first embodiment.

Figure 2G:
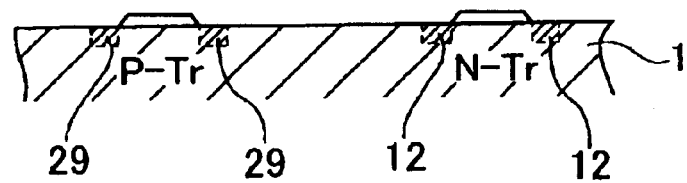
FIG. 2G is a drawing showing the process of semiconductor device production method of a second embodiment of the present invention.
Figure 3A:
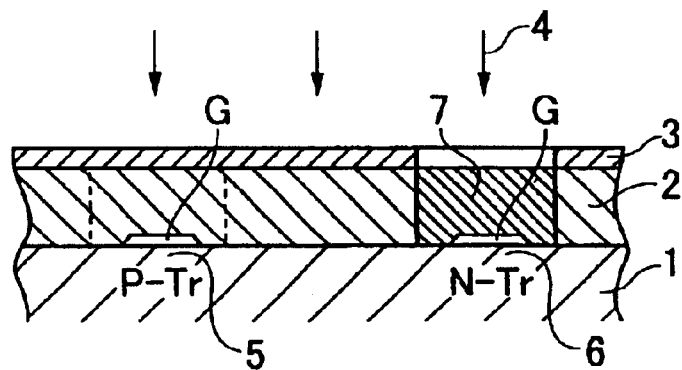
FIG. 3A is a drawing showing the process of semiconductor device production method of the prior art.
Figure 3B:
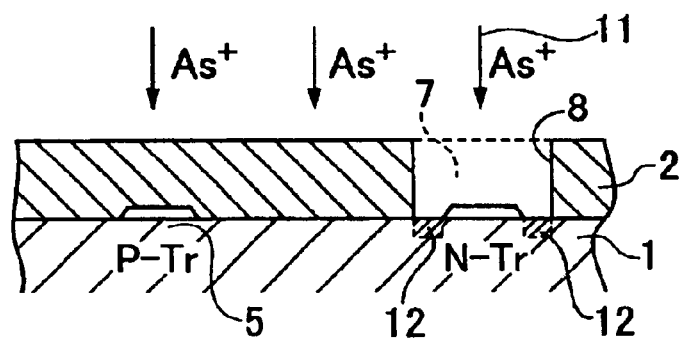
FIG. 3B is a drawing showing the process of semiconductor device production method of the prior art.
Figure 3C:
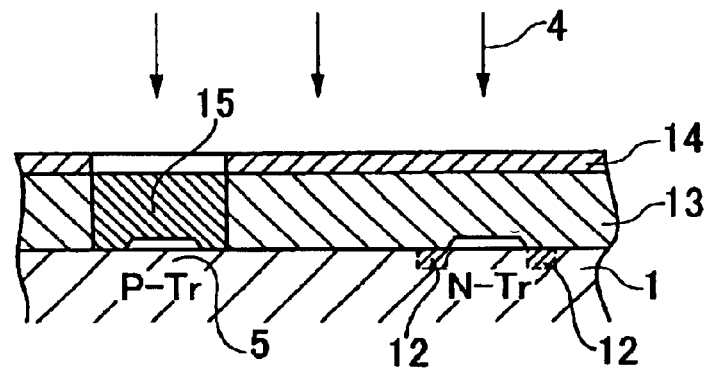
FIG. 3C is a drawing showing the process of semiconductor device production method of the prior art.
Figure 3D:
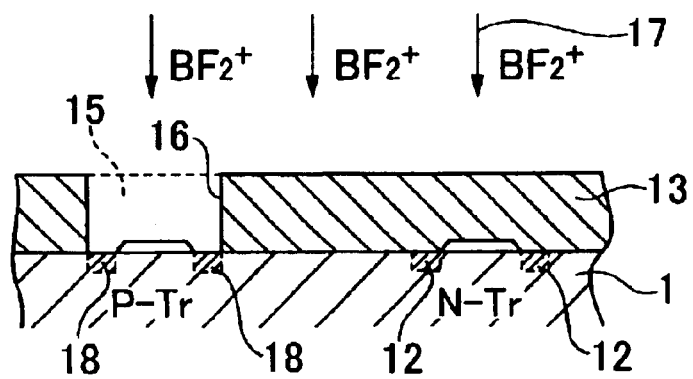
FIG. 3D is a drawing showing the process of semiconductor device production method of the prior art.

In this manner, as shown in FIG. 2G, the P region 29 and the N region 12 can be formed on the N silicon substrate 1, and there is no risk of resist remaining as in the prior art. A CMOSIC can then be fabricated using the N silicon substrate 1 obtained in this manner.

As has been explained in detail above, according to the semiconductor device production method of the present embodiment, action and effects can be demonstrated that are completely similar to those of the above-mentioned first embodiment.

Moreover, since the silicon oxide film 31 serving as an etching stopper layer is formed between the first resist layer 21 and the second resist layer 25, etching is stopped by the silicon oxide film 31 during removal of the second resist layer 25 by etching, and is able to inhibit etching from proceeding beyond that layer, thereby making it possible to effectively remove the second resist layer 25 without damaging the pattern.

Although the above has provided an explanation of each embodiment of the semiconductor device production method of the present invention based on the drawings, specific constitutions are not limited to the present embodiments, but rather the design and so forth may be altered provided it is within a range that does not deviate from the gist of the present invention.

For example, although positive types of the first resist layer 21 and the second resist layer 25 were used in each of the above embodiments, similar effects can also be demonstrated even if negative types are used.

In addition, although the silicon oxide film 31 was used for the etching stopper layer in the second embodiment, this silicon oxide, film 31 may be any other type of film provided it has the function of an etching stopper layer during etching of the second resist layer 25.

What is claimed is:

1. A semiconductor device production method for forming a first conductive region and a second conductive region on a semiconductor substrate; comprising steps of:

laminating a first resist layer having desired patterns on said semiconductor substrate;

laminating a second resist layer having desired patterns on the first resist layer;

forming a first conductive region on the semiconductor substrate by injecting a first conducting ion into said semiconductor substrate using said first and second resist layers as masks;

removing said second resist layer;

forming a second conductive region on said semiconductor substrate by injecting a second conducting ion of a conductive type opposite to that of said first conducting ion into said semiconductor substrate using the remaining first resist layer as a mask; and removing said first resist layer.

2. A semiconductor device production method according to claim 1 wherein; during removal of said second resist layer, said second resist layer and a surface portion of said first resist layer are removed using an etching material having a lower etching rate than an etching material that removes said first resist layer.

3. A semiconductor device production method for forming a first conductive region and a second conductive region on a semiconductor substrate comprising steps of:

laminating a first resist layer having a desired pattern, on said semiconductor substrate;

laminating an etching stopper layer on the first resist layer;

laminating a second resist layer having desired patterns on the etching stopper layer;

forming a first conductive region on said semiconductor substrate by injecting a first conducting ion into said semiconductor substrate using said first resist layer, etching stopper layer, and second resist layer as masks;

removing said second resist layer and said etching stopper layer;

forming a second conductive region on said semiconductor substrate by injecting a second conducting ion of a conductive type opposite to that of said first conducting ion into said semiconductor substrate using the remaining first resist layer as a mask; and removing said first resist layer.

4. A semiconductor device production method according to claim 3 wherein, said etching stopper layer has resistance to said etching material that removes said second resist layer.

5. A semiconductor device production method according to claim 1 wherein, said first resist layer has lower exposure sensitivity than said second resist layer.

6. A semiconductor device production method according to claim 2 wherein, said first resist layer has lower exposure sensitivity than said second resist layer.

7. A semiconductor device production method according to claim 3 wherein, said first resist layer has lower exposure sensitivity than said second resist layer.

8. A semiconductor device production method according to claim 4 wherein, said first resist layer has lower exposure sensitivity than said second resist layer.

9. A semiconductor device production method according to claim 1 wherein, injected amount of said first ion is greater than injected amount of said second ion.

10. A semiconductor device production method according to claim 2 wherein, injected amount of said first ion is greater than injected amount of said second ion.

11. A semiconductor device production method according to claim 3 wherein, injected amount of said first ion is greater than injected amount of said second ion.

12. A semiconductor device production method according to claim 4 wherein, injected amount of said first ion is greater than injected amount of said second ion.

13. A semiconductor device production method according to claim 5 wherein, injected amount of said first ion is greater than injected amount of said second ion.

14. A semiconductor device production method according to claim 6 wherein, injected amount of said first ion is greater than injected amount of said second ion.

15. A semiconductor device production method according to claim 7 wherein, injected amount of said first ion is greater than injected amount of said second ion.

16. A semiconductor device production method according to claim 8 wherein, injected amount of said first ion is greater than injected amount of said second ion.

* * * * *